United States Patent
Dunham et al.

(10) Patent No.: US 8,717,752 B2
(45) Date of Patent: May 6, 2014

(54) DRIVE ENCLOSURES FOR TOOL-LESS REMOVABLE MOUNTING OF SOLID STATE DRIVES ONTO PRINTED CIRCUIT BOARD DEVICES

(75) Inventors: John M. Dunham, Kechi, KS (US); Jason M. Stuhlsatz, Dacula, GA (US); Ron G. Duren, Denver, CO (US)

(73) Assignee: LSI Corporation, Milpitas, CA (US)

( * ) Notice: Subject to any disclaimer, the term of this patent is extended or adjusted under 35 U.S.C. 154(b) by 315 days.

(21) Appl. No.: 13/170,852

(22) Filed: Jun. 28, 2011

(65) Prior Publication Data

US 2013/0003320 A1      Jan. 3, 2013

(51) Int. Cl.
G06F 1/16      (2006.01)
H05K 7/14      (2006.01)

(52) U.S. Cl.
USPC ............ 361/679.31; 361/679.02; 248/222.11; 312/223.2

(58) Field of Classification Search
USPC ............ 361/748, 760, 679.01, 736, 752, 600, 361/679.02, 679.31–679.37, 679.57, 761, 361/807; 248/222.11, 200; 312/223.2
See application file for complete search history.

(56) References Cited

U.S. PATENT DOCUMENTS

| | | | |
|---|---|---|---|
| 4,766,652 A * | 8/1988 | Sugiura | 24/453 |
| 5,563,769 A | 10/1996 | Macgregor | |
| 5,726,859 A * | 3/1998 | Khadem et al. | 361/760 |
| 5,788,211 A * | 8/1998 | Astier | 248/674 |
| 6,114,626 A * | 9/2000 | Barnes et al. | 174/542 |
| 6,137,689 A * | 10/2000 | Schechtel et al. | 361/759 |
| 6,452,790 B1 | 9/2002 | Chu et al. | |
| 6,762,932 B2 * | 7/2004 | Regimbal et al. | 361/679.33 |
| 7,262,958 B2 * | 8/2007 | Marroquin et al. | 361/679.33 |
| 7,517,231 B2 | 4/2009 | Hiew et al. | |
| 7,517,252 B2 | 4/2009 | Ni et al. | |
| 7,576,990 B2 | 8/2009 | Ni et al. | |
| 7,944,703 B2 | 5/2011 | Ni et al. | |
| 8,213,174 B1 * | 7/2012 | Kapahi et al. | 361/679.36 |
| 2009/0086448 A1 | 4/2009 | Hiew et al. | |
| 2010/0217909 A1 | 8/2010 | Pavol et al. | |
| 2010/0281209 A1 | 11/2010 | Ni et al. | |

FOREIGN PATENT DOCUMENTS

| | | |
|---|---|---|
| DE | 4033833 | 4/1992 |
| EP | 0589708 | 3/1994 |
| WO | WO2011022083 | 2/2011 |

* cited by examiner

Primary Examiner — Angel R Estrada
Assistant Examiner — Dimary Lopez Cruz
(74) Attorney, Agent, or Firm — Duft Bornsen & Fettig

(57) ABSTRACT

Methods and systems for removably mounting a Solid State Drive (SSD) to a Printed Circuit Board (PCB) device without use of a tool. An exemplary system comprises a top portion and at least two flexible legs. Each leg comprises a vertical member attached to the top portion, and a tab for insertion into the PCB, the tab restricting the motion of the drive enclosure with respect to the PCB when inserted into the PCB, thereby allowing for removable attachment of the enclosure to the PCB without use of a tool. The drive enclosure itself is adapted to receive the SSD and adapted to align the SSD for physical coupling with a connector for the PCB.

15 Claims, 5 Drawing Sheets

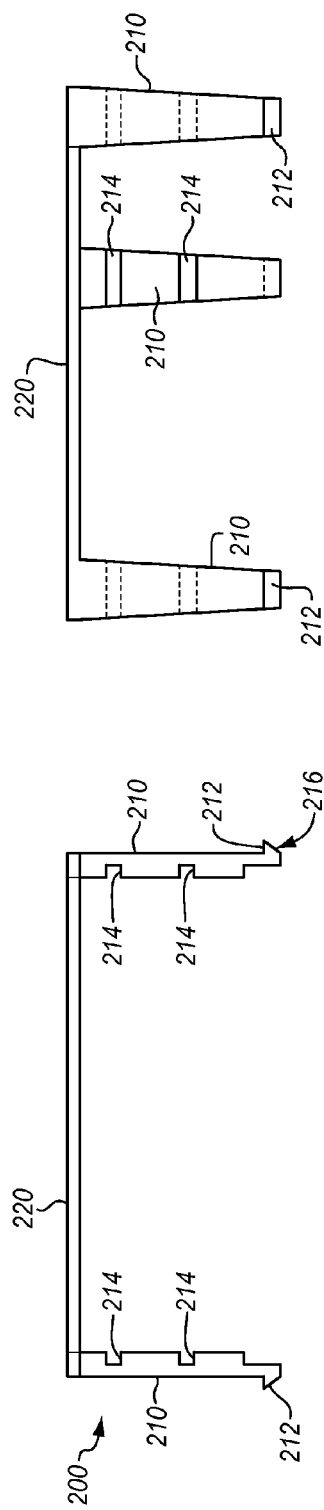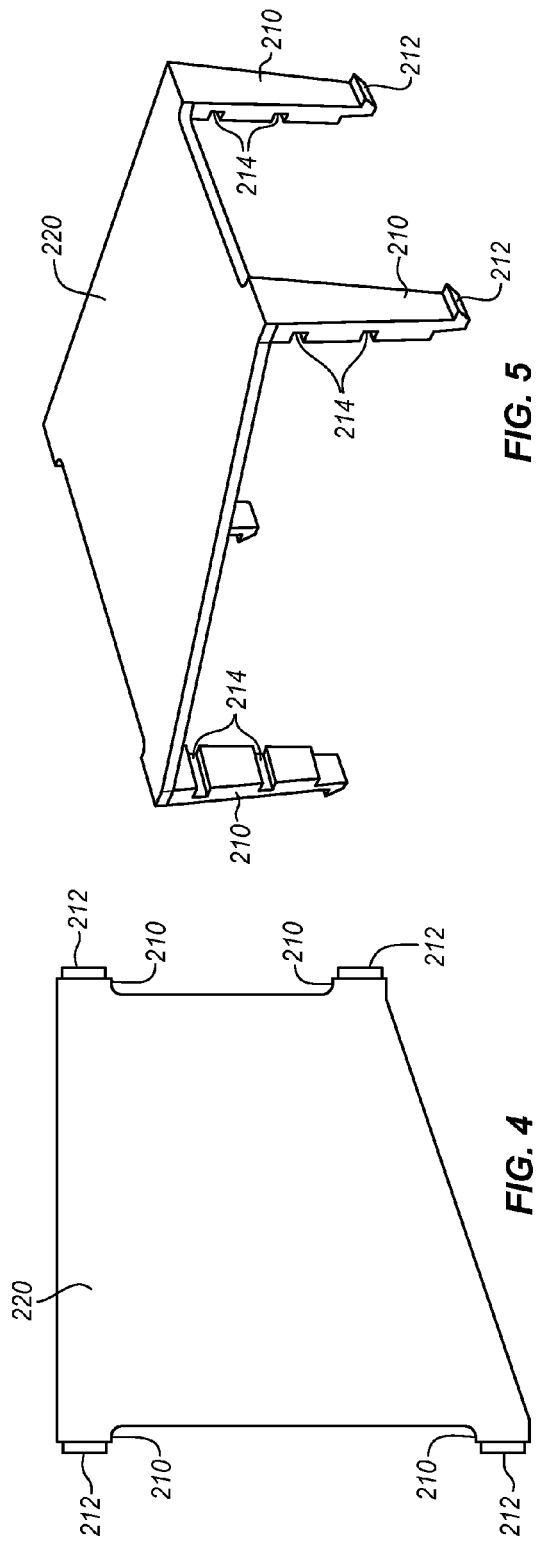

DRIVE ENCLOSURES FOR TOOL-LESS REMOVABLE MOUNTING OF SOLID STATE DRIVES ONTO PRINTED CIRCUIT BOARD DEVICES

BACKGROUND

1. Field of the Invention

The invention relates generally to Printed Circuit Board (PCB) devices and more specifically relates to systems and devices for mounting a Solid State Drive (SSD) onto a PCB device.

2. Discussion of Related Art

In the field of electronics, a cost effective method of mass producing circuits includes printing the circuits onto a non-conductive board. The board itself helps to mechanically support and electrically connect electronic components of the circuit. The most common material for use in such boards is FR-4, which is made of woven glass and epoxy components. Because Printed Circuit Board (PCB) devices are typically intended for use within a larger system, PCB devices often include a number of adapters, connectors, and other features for integration with various electronic systems and hardware. For example, a Peripheral Component Interconnect Express (PCI-E) device may be crafted out of PCB into a "card" that may be inserted into an expansion slot of a motherboard or bus of a computer. A PCB device may also be referred to as a Printed Circuit Assembly (PCA) or a Printed Circuit Board Assembly (PCBA) device. PCB devices typically utilize storage devices such as disk drives, optical media, Solid State Drives (SSDs), and others in order to engage in day-to-day operations.

In the field of storage systems, storage controllers and other electronics are often implemented as PCB devices. These PCB devices include multiple electronic connectors (e.g., SAS or SATA connectors) that are used to communicably couple the PCB device with other components of the storage system. An example of such a component is an SSD of the storage system. When an SSD is to be physically mounted at a PCB device, the SSD may be placed into an enclosure, and then the enclosure itself may be screwed, glued, or soldered into place on the PCB itself. The SSD is aligned within the enclosure so that it can be physically coupled with one of the electronic connectors for the PCB device.

Unfortunately, storage systems and other electronic systems are often subject to changing demands from a customer. The demands may change as the customer's use of the electronic system increases, decreases, or otherwise changes over time. Thus, it is generally desirable to allow field engineers to change the configuration of a PCB device in order to match the present demands of a customer. An example of a changed configuration could include altering the nature and number of components connected to the PCB device via its electronic connectors. For example, a field engineer may desire to increase or decrease the number and/or capacity of SSDs attached to the device. Where SSDs are coupled with the PCB by glue, screws, etc., it remains a problem for a field engineer to easily reconfigure the system.

Thus it is an ongoing challenge to provide enclosures for SSDs that allow a field engineer to alter the configuration of a PCB device.

SUMMARY

The present invention solves the above and other problems, thereby advancing the state of the useful arts, by providing a drive enclosure (and associated methods and systems) for removably mounting a Solid State Drive (SSD) onto a Printed Circuit Board (PCB) device. Furthermore, the drive enclosure includes tabs that allow for removable attachment of the enclosure to a PCB device without use of a tool. This in turn simplifies the process of reconfiguring a PCB device, allowing a field engineer to quickly alter the manner in which an electronic system is organized. Because the present systems and methods allow for fast alteration of the configuration of a PCB device, these systems and methods significantly reduce the amount of down time that an electronic system will experience during the reconfiguration process.

In one aspect hereof, a drive enclosure for mounting an SSD to a PCB is provided. The drive enclosure comprises a top portion and at least two flexible legs. Each leg comprises a vertical member attached to the top portion, and a tab for insertion into the PCB, the tab restricting the motion of the drive enclosure with respect to the PCB when inserted into the PCB, thereby allowing for removable attachment of the enclosure to the PCB without use of a tool. The drive enclosure itself is adapted to receive the SSD and adapted to align the SSD for physical coupling with a connector for the PCB.

In a further aspect hereof, a system is provided comprising a storage controller and a drive enclosure. The storage controller comprises a PCB and a connector adapted to physically couple with an SSD, and the storage controller is adapted to utilize the SSD while managing operations of the storage system. The drive enclosure comprises a top portion and at least two flexible legs. Each leg comprises a vertical member attached to the top portion, and a tab for insertion into the PCB of the storage controller, the tab restricting the motion of the drive enclosure with respect to the PCB when inserted into the PCB, thereby allowing for removable attachment of the enclosure to the storage controller without use of a tool. The drive enclosure itself is adapted to receive the SSD and align the SSD for physical coupling with the connector of the storage controller.

In a further aspect hereof, a method is provided for mounting an SSD to a PCB by use of a drive enclosure, wherein the drive enclosure comprises a top portion and at least two flexible legs, each leg comprising a vertical member attached to the top portion, and each leg further comprising a tab for insertion into the PCB of the storage controller. The method comprises inserting the SSD into the drive enclosure, thereby aligning the SSD for physical coupling with a connector for the PCB. The method further includes manually applying force to flex the legs toward an interior of the drive enclosure, and inserting the tabs of the legs into the PCB, the tabs restricting the motion of the drive enclosure with respect to the PCB when inserted into the PCB, thereby removably attaching the enclosure to the PCB without use of a tool. Additionally, the method includes physically coupling the SSD to a connector for the PCB.

BRIEF DESCRIPTION OF THE DRAWINGS

FIGS. 2-5 are front, side, top, and perspective views of an exemplary enclosure for an SSD in accordance with features and aspects hereof.

DETAILED DESCRIPTION OF THE DRAWINGS

Figure 1:
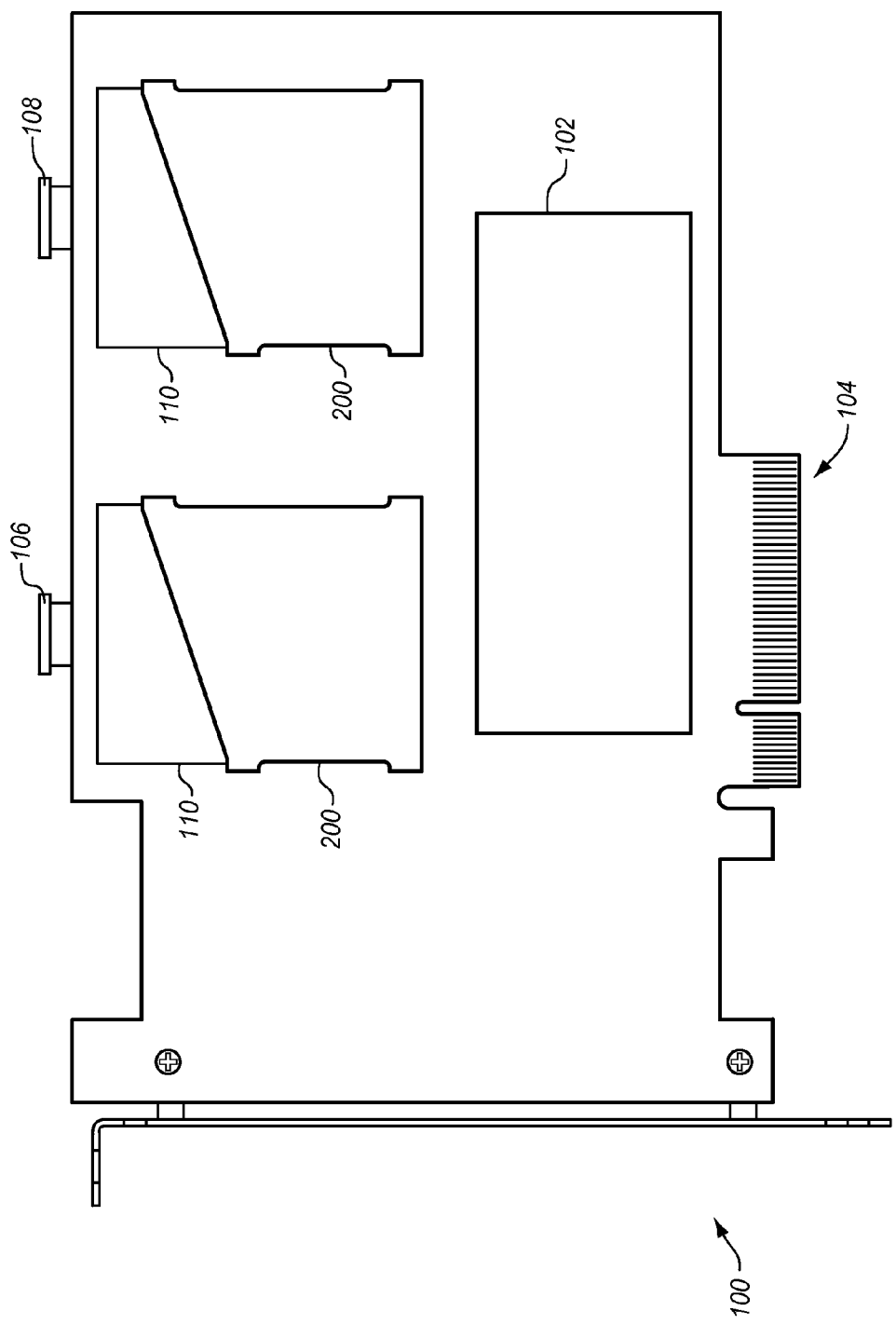
FIG. 1 is a diagram illustrating an exemplary PCB device adapted for communication with an electronic system in accordance with features and aspects hereof.

FIG. 1 is a diagram illustrating an exemplary PCB device 100 adapted for communication with an electronic system in accordance with features and aspects hereof. In this embodiment, PCB device 100 includes a processor 102 coupled with interfaces 104-108. Interface 104 is implemented as a Peripheral Component Interconnect Express (PCIE) connector, while interfaces 106 and 108 are implemented as integrated SAS/SATA components of PCB device 100, and are designed for attachment to SSDs 110. SSDs 110 are mounted onto the board of PCB device 100 by use of drive enclosures 200. Note that the particular purpose of PCB device 100 is not essential to this invention. Rather, the above exemplary embodiment has been provided only for illustrative purposes in order to frame a scenario wherein use of a tool-less enclosure may be valuable.

Drive enclosures 200 provide a significant benefit over existing systems because they include legs having tabs that allow the enclosures 200 to be attached and removed from PCB device 100 without use of a tool. This in turn allows a field engineer to remove or add SSDs in a manner that is time efficient and also requires little effort.

FIGS. 2-5 are front, side, top, and perspective views of an exemplary enclosure 200 for an SSD 110 in accordance with features and aspects hereof. In particular, FIG. 2 is a front view, FIG. 3 is a side view, FIG. 4 is a top view, and FIG. 5 is a perspective view of enclosure 200. According to FIGS. 2-5, enclosure 200 comprises a top portion 220 and at least two flexible legs for mounting enclosure 200 to the PCB of PCB device 100. The flexible legs of enclosure 200 may be elastically flexed inward or outward from enclosure 200, and may return to their original straight configuration when the flexing force is released.

Each leg of enclosure 200 comprises a vertical member 210 and a tab 212 for insertion into the board. Typically, each vertical member 210 will comprise a portion that is capable of flexing and experiencing elastic deformation. This flexible portion of vertical member 210 may therefore be made of materials such as plastics, metal alloys, or elastomers that are capable of experiencing elastic deflection. It will be appreciated that when the length of vertical members 210 is great in relation to the overall deflection desired to allow insertion of tab 212, the material used for the elastic portion of vertical member 210 will not need to be very elastic. In contrast, when then length of vertical members 210 is short in relation to the desired deflection, the material used for the elastic portion of vertical member 210 may be greatly elastic. Typically, vertical members 210 will all be of equal height, although it is possible that they may have varying lengths, widths, and heights as appropriate for the PCB that they are designed to mate with.

Tabs 212 are designed for insertion into the PCB of PCB device 100. Accordingly, the legs of enclosure 200 may be located at enclosure 200 so as to align tabs 212 with receptacles at the PCB of PCB device 100. These receptacles may comprise holes, catches, etc. within PCB device 100 designed for receiving tabs 212. In one embodiment, a receptacle comprises an outer edge of the PCB designed to receive a tab 212. Tabs 212 are adapted to enter the receptacles of the PCB, and are further adapted to snap into place at the receptacles, thereby mounting enclosure 200 to PCB device 100. Preferably, tabs 212 comprise an angled portion/barb/cam 216 for slidable insertion into receptacles on the PCB. Angled portions 216 of tabs 212 will elastically deflect the legs of enclosure 200 when the downward force is applied, thereby allowing tabs 312 to slide downward into the receptacles. In this manner, when a downward force is applied to top portion 220, tabs 212 will enter receptacles on the PCB. Thus, when tabs 212 are fully inserted into the receptacles of PCB device 100, the legs allow tabs 212 to snap into the receptacles, constraining the motion of enclosure 200 in relation to PCB device 100.

In a further embodiment, some or all of tabs 212 may comprise an electrically nonconductive material (e.g., a polycarbonate plastic, rubber, etc.) or may be coated in an electrically nonconductive material. This may be important because tabs 212 may come into contact with electrical components, traces, or leads of PCB device 100 while enclosure 200 is mounted at PCB device 100. If tabs 212 are electrically conductive, they may cause a short or otherwise compromise the electrical integrity of PCB device 100.

Enclosure 200 may additionally comprise elements 214 for housing/installing an SSD into enclosure 200. Elements 214 may comprise recessed portions of legs of enclosure 200, adapted to allow an SSD to be press fit into enclosure 200. Elements 214 may alternatively comprise threaded holes for installing an SSD within enclosure 200, before or after enclosure 200 itself is manually mounted onto PCB device 100 without use of a tool. In further embodiments, elements 214 may install an SSD within enclosure 200 by use of pins and clips or "snap in" mechanisms. When an SSD is installed within enclosure 200 and enclosure 200 has been mounted onto PCB device 100, enclosure 200 aligns the SSD for physical coupling with a connector of PCB device 100.

Note that all components of enclosure 200 should comprise materials and dimensions that provide sufficient strength to withstand the forces that are applied to enclosure 200 during mounting and removal of an SSD, and also during the mounting and removal of enclosure 200 to PCB device 100. Additionally, enclosure 200 may comprise further components (e.g., side walls or other features) for providing further mechanical strength to the body of enclosure 200.

Figure 6:
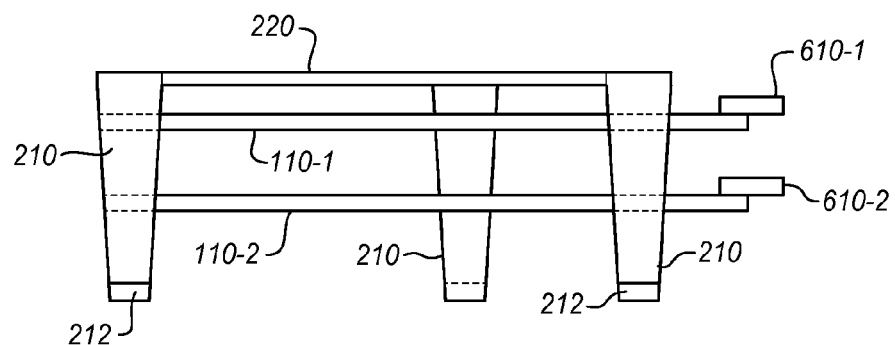
FIG. 6 is a diagram illustrating two SSDs housed by an exemplary enclosure in accordance with features and aspects hereof.

FIG. 6 is a diagram illustrating two SSDs 110 housed by an exemplary enclosure 200 in accordance with features and aspects hereof. In particular, FIG. 6 illustrates a side view of enclosure 200 as it houses two SSDs 110-1 and 110-2. Additionally, in this embodiment, each SSD includes a connector 610 for coupling with a connector of PCB device 100 (i.e., SSD 110-1 includes connector 610-1, and SSD 110-2 includes connector 610-2).

Figure 7:
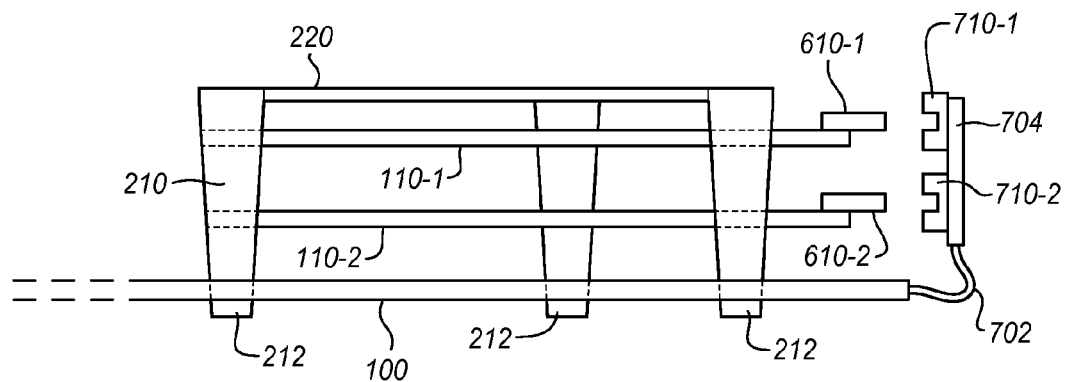
FIG. 7 is a diagram illustrating an exemplary enclosure mounted to a PCB device in accordance with features and aspects hereof.
Figure 8:
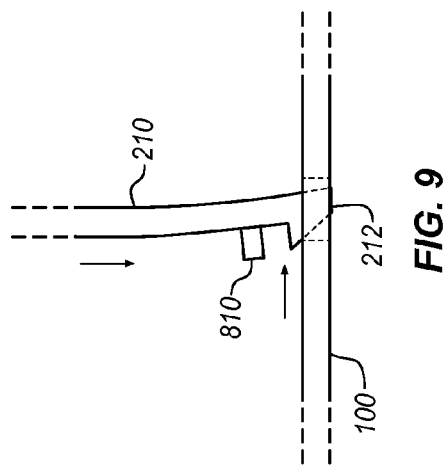
FIGS. 8-11 illustrate an exemplary technique of tool-less insertion and removal of a leg of an enclosure into a receptacle of a PCB device in accordance with features and aspects hereof.

FIG. 7 is a diagram illustrating an exemplary enclosure 200 mounted to a PCB device 100 in accordance with features and aspects hereof. In this embodiment, enclosure 200 has been snapped into receptacles (e.g., holes or edges) at PCB device 100, and tabs 212 therefore extrude outward beneath the lower surface of the PCB of PCB device 100. In this embodiment, PCB device 100 further comprises a flexible cable 702 attached to a PCB component 704. PCB component 704 includes connectors 710-1 and 710-2 that may be aligned with connectors 610-1 and 610-2 of SSDs 110 housed by enclosure 200.

As illustrated in FIG. 7, while mounted to PCB device 100, enclosure 200 is substantially open, and allows air to flow across SSDs 110. Thus, if airflow or the flow of another cooling fluid is provided at PCB device 100, SSDs 110 may benefit from convective cooling as the air travels across the surface of SSDs 110. This may be particularly desirable for PCB devices that are only allowed to generate a small amount of heat. This may also be desirable when a PCB device only receives a set, limited amount of Linear Feet per Minute (LFM) of airflow.

FIGS. 8-11 illustrate an exemplary technique of tool-less insertion and removal of a leg of an enclosure 200 into a receptacle 800 of a PCB device 100 in accordance with features and aspects hereof. According to FIG. 8, tab 212 of a leg of enclosure 200 is aligned for insertion into a receptacle 800 of PCB device 100. In this embodiment, the leg further comprises a catch 810. Catch 810 is designed to prevent over-insertion of the leg into receptacle 800. Catch 810 may be a specific distinctive feature of the leg, or may be a portion of the leg that has increased thickness, thereby preventing the leg from traveling too far into receptacle 800. Note that in FIG. 8, tab 212 is aligned so that an angled portion of tab 212 hovers over an edge of receptacle 800.

Figure 9:
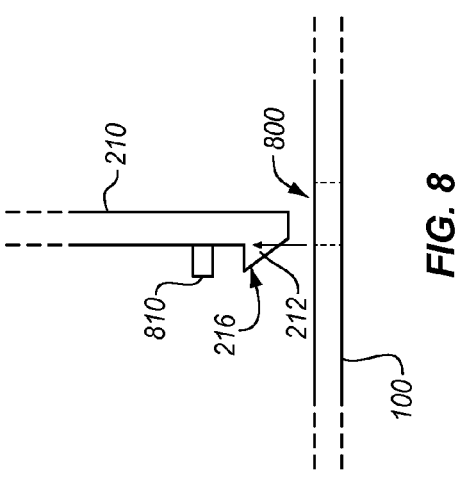
Figure 10:
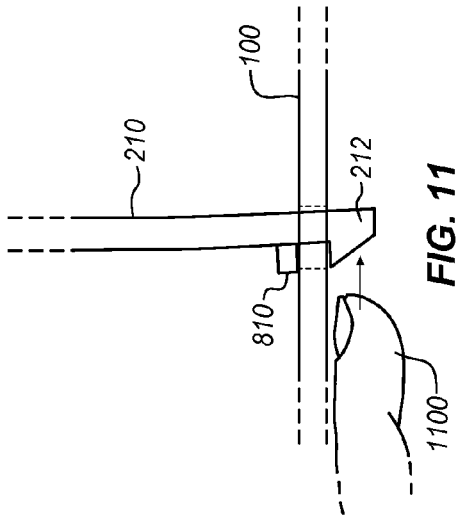

According to FIG. 9, a downward force is applied to the leg via vertical member 210. When the downward force is applied, angled portion 216 (e.g., a cam surface) of tab 212 slides downward and deflects the leg to the right and into receptacle 800. The deflection of the leg is substantially elastic at this stage, and the leg therefore applies a restorative force against an edge of receptacle 800 that attempts to push tab 212 to the left. In FIG. 10, tab 212 has been fully inserted into receptacle 800, and catch 810 prevents further insertion of the leg into receptacle 800. Additionally, angled portion 216 of tab 212 is no longer in contact with an edge of receptacle 800. Therefore, tab 212 moves to the left and snaps into place, owing to the restorative force applied by the leg as it returns to its original shape.

Figure 11:
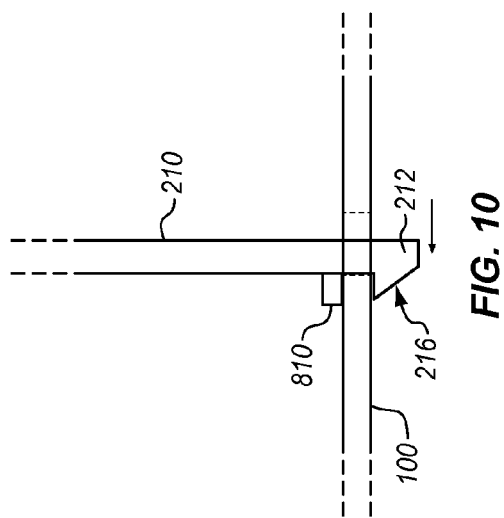

In FIG. 11, a field engineer manually flexes the leg of enclosure 200 to allow the leg to be removed from PCB device 100. In this embodiment, the manual force provided to cause deflection is the result of a finger 1100 being pressed against tab 212. Note that none of the figures in this application, including FIG. 11, are necessarily to scale. Therefore, especially with regard to FIG. 11, the size of finger 1100 or other features does not necessarily indicate the size of tab 212, vertical member 210, or other physical features of enclosure 200. Rather these figures are used for illustrative purposes only.

Figure 12:
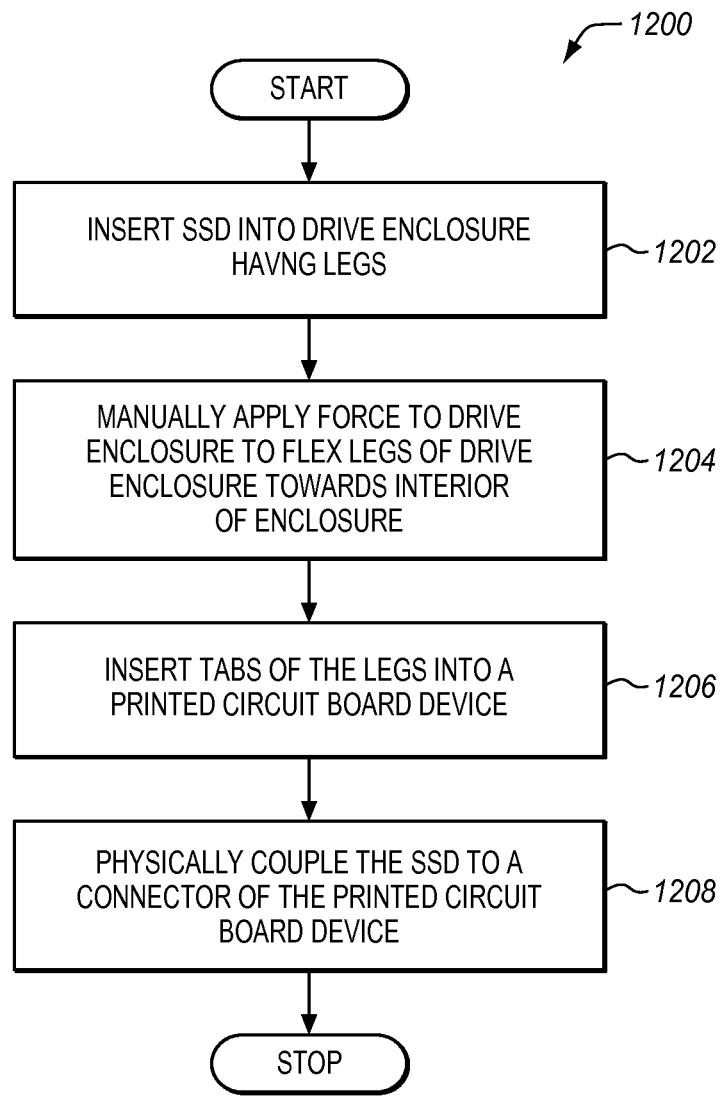
FIG. 12 is a flowchart describing a method in accordance with features and aspects hereof to removably attach an enclosure for an SSD device to a PCB device without use of a tool.

FIG. 12 is a flowchart describing a method 1200 in accordance with features and aspects hereof to removably attach an enclosure for an SSD to a PCB device without use of a tool. In step 1202, a user inserts an SSD into a drive enclosure. The SSD may be inserted by a press fit, or may be snapped (or, alternatively, screwed) into place by the user at enclosure 200 before enclosure 200 is mounted at PCB device 100 without use of a tool. In step 1204, the user applies manual force to flex the legs of the drive enclosure inward towards an interior portion of the enclosure, thereby causing deflection of the legs. Note that a user need not manually flex each leg. Rather, it may be desirable for a user to merely apply a downward force to a top portion of the enclosure. This in turn engages angled portion 216 of tab 212 with the PCB in order to flex the leg. If tabs of the enclosure are properly aligned with receptacles of the PCB device, the downward force may cause the tabs to deflect the legs inward. As soon as the tabs have been inserted into the PCB device, as in step 1206, the motion of the drive enclosure with respect to the PCB device is substantially restrained. Thus, with the enclosure now successfully mounted to the PCB device, a user may physically couple the SSD to a connector of the PCB device, as in step 1208.

While the invention has been illustrated and described in the drawings and foregoing description, such illustration and description is to be considered as exemplary and not restrictive in character. One embodiment of the invention and minor variants thereof have been shown and described. In particular, features shown and described as exemplary software or firmware embodiments may be equivalently implemented as customized logic circuits and vice versa. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A drive enclosure for mounting a Solid State Drive (SSD) to a Printed Circuit Board (PCB), the drive enclosure comprising:
   a top portion; and
   at least two flexible legs, each leg comprising a vertical member attached to the top portion, each leg further comprising a tab for insertion into the PCB, the tab restricting the motion of the drive enclosure with respect to the PCB when inserted into the PCB, thereby allowing for removable attachment of the enclosure to the PCB without use of a tool,
   wherein the drive enclosure is adapted to receive the SSD and adapted to align the SSD for physical coupling with a connector for the PCB,
   wherein the legs of the drive enclosure each comprise a recessed portion along an interior of the drive enclosure, the recessed portions adapted to press fit the SSD into the drive enclosure.

2. The drive enclosure of claim 1, wherein:
   the drive enclosure is further adapted to receive a cooling fluid traveling across the PCB, wherein the drive enclosure is substantially open to allow the cooling fluid to travel across the surface of the SSD within the drive enclosure.

3. The drive enclosure of claim 2, wherein:
   the fluid comprises air.

4. The drive enclosure of claim 1, wherein:
   the tab of each leg comprises an electrically nonconductive material.

5. The drive enclosure of claim 1, wherein:
   the tab of each leg is adapted for alignment with a receptacle of the PCB.

6. The drive enclosure of claim 1, wherein:
   the top portion and the legs are portions of a single piece.

7. The drive enclosure of claim 1, wherein:
   the tab of each leg further comprises an angled portion, the angled portion adapted to flex the leg when inserted into receptacles of the PCB, thereby slidably inserting the tab into the PCB.

8. The drive enclosure of claim 1, wherein:
   the drive enclosure is further adapted to enclose two SSDs.

9. A system comprising:
   a storage controller comprising a Printed Circuit Board (PCB) and a connector adapted to physically couple with a Solid State Drive (SSD) memory, the storage controller adapted to utilize the SSD while managing operations of the storage system; and
   a drive enclosure for mounting the SSD to the PCB, the drive enclosure comprising:
   a top portion; and
   at least two flexible legs, each leg comprising a vertical member attached to the top portion, each leg further comprising a tab for insertion into the PCB of the storage controller, the tab restricting the motion of the drive enclosure with respect to the PCB when inserted into the PCB, thereby allowing for removable attachment of the enclosure to the storage controller without use of a tool, wherein the drive enclosure is adapted to receive the SSD and align the SSD for physical coupling with the connector of the storage controller, wherein the legs of the drive enclosure each comprise a recessed portion along an interior of the drive enclosure, the recessed portions adapted to press fit the SSD into the drive enclosure.

10. The system of claim 9, wherein:

the drive enclosure is further adapted to receive a cooling fluid traveling across the PCB, wherein the drive enclosure is substantially open to allow the cooling fluid to travel across the surface of the SSD within the drive enclosure.

11. The system of claim 10, wherein:

the fluid comprises air.

12. The system of claim 9, wherein:

the tab of each leg comprises an electrically nonconductive material.

13. The system of claim 9, wherein:

the tab of each leg is adapted for alignment with a receptacle of the PCB.

14. The system of claim 9, wherein:

the top portion and the legs are portions of a single piece.

15. The system of claim 9, wherein:

the tab of each leg further comprises an angled portion, the angled portion adapted to flex the leg when inserted into receptacles of the PCB, thereby slidably inserting the tab into the PCB.

* * * * *